US012757360B2

(12) United States Patent
Siewert et al.

(10) Patent No.: US 12,757,360 B2
(45) Date of Patent: Oct. 6, 2026

(54) COOLING DEVICE

(71) Applicant: ERWIN QUARDER SYSTEMTECHNIK GMBH, Espelkamp (DE)

(72) Inventors: Georg Siewert, Pohlheim (DE); Stefan Bruns, Osnabrück (DE); Alexander Heitbrink, Stemwede (DE)

(73) Assignee: ERWIN QUARDER SYSTEMTECHNIK GMBH, Espelkamp (DE)

( * ) Notice: Subject to any disclaimer, the term of this patent is extended or adjusted under 35 U.S.C. 154(b) by 331 days.

(21) Appl. No.: 18/384,577

(22) Filed: Oct. 27, 2023

(65) Prior Publication Data

US 2024/0147678 A1 May 2, 2024

(30) Foreign Application Priority Data

Oct. 28, 2022 (DE) ..................... 10 2022 128 698.3

(51) Int. Cl.
*H05K 7/20* (2006.01)

(52) U.S. Cl.
CPC ..... *H05K 7/20927* (2013.01); *H05K 7/20263* (2013.01)

(58) Field of Classification Search
CPC ........... H05K 7/20136; H05K 7/20236; H05K 7/20263; H05K 7/20272; H05K 7/2039; H05K 7/205; H05K 7/209; H05K 7/20927; H05K 1/0209; H05K 1/144; H05K 1/145;

(Continued)

(56) References Cited

U.S. PATENT DOCUMENTS

| | | | | |
|---|---|---|---|---|
| 6,111,749 | A | 8/2000 | Lamb et al. | |
| 7,696,532 | B2 * | 4/2010 | Knapp | H01L 23/36 257/718 |
| 11,357,139 | B2 * | 6/2022 | Lee | H01L 23/44 |

(Continued)

FOREIGN PATENT DOCUMENTS

| | | |
|---|---|---|
| DE | 10 2007 052 397 A1 | 5/2009 |
| DE | 10 2019 003 030 A1 | 11/2019 |

(Continued)

OTHER PUBLICATIONS

EP-1672692-A1 English Translation (Year: 2006).*

*Primary Examiner* — Amir A Jalali
(74) *Attorney, Agent, or Firm* — Oliff PLC

(57) ABSTRACT

A cooling device for dissipating having a first hybrid cooling component through cooling fluid can be guided and has a heat sink of metal or of a metal alloy, which is rigid and connected in a fluid-tight manner to a base body of plastics material of the first hybrid cooling component and which is to be arranged on objects to be cooled, and having a second hybrid cooling component connected releasably to the first hybrid cooling component and through which cooling fluid can be guided, having a plurality of cooling component portions which are connected together in pairs in an articulated manner, having a heat sink of metal which is arranged on objects to be cooled and connected in a fluid-tight manner to a base body of plastics material of the second hybrid cooling component, wherein the two hybrid cooling components are positioned at a distance from one another.

30 Claims, 6 Drawing Sheets

Figure 1:
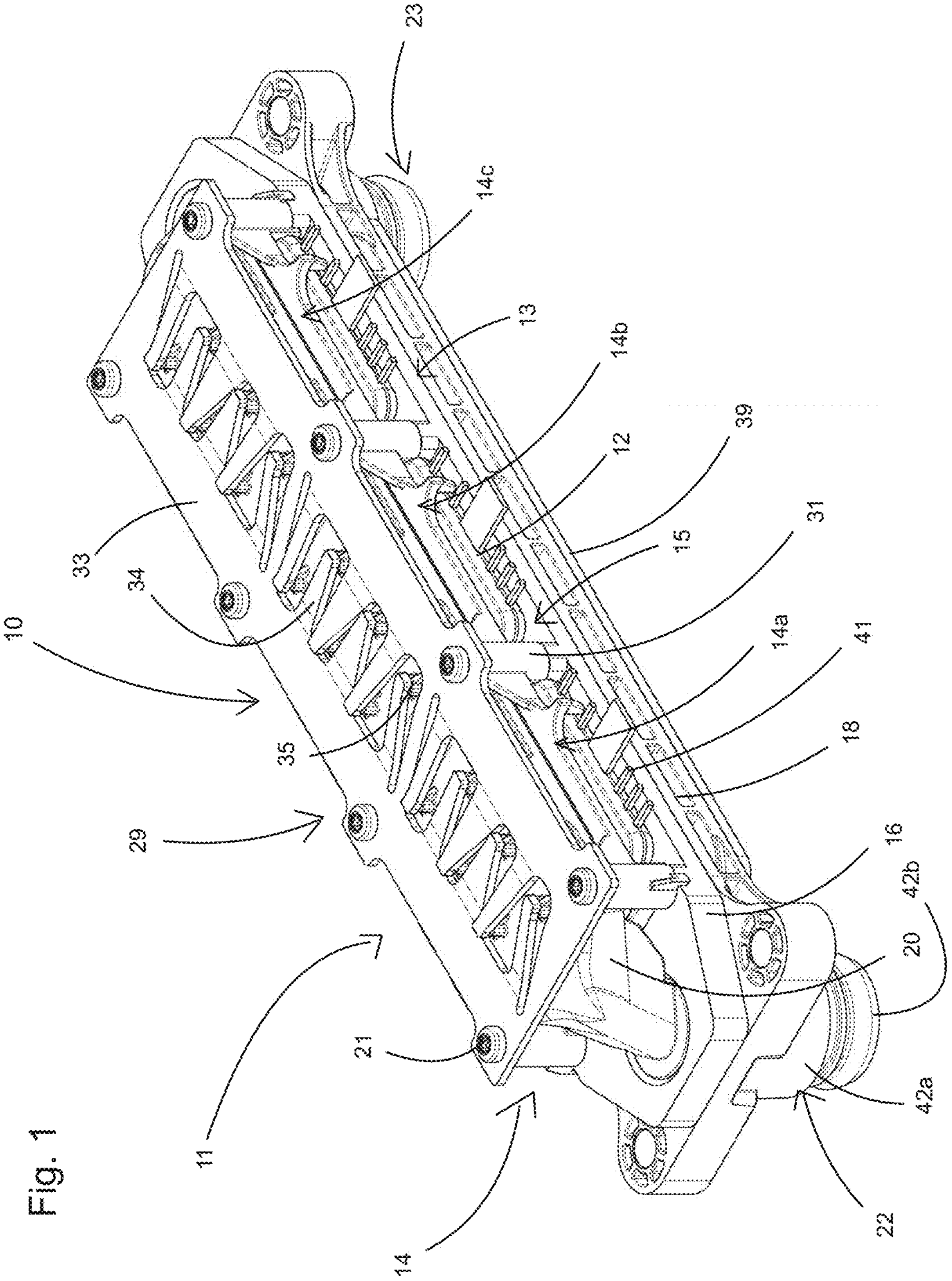

(58) Field of Classification Search
CPC .. H05K 9/0015; H05K 2201/064; G06F 1/20; G06F 2200/201
See application file for complete search history.

(56) References Cited

U.S. PATENT DOCUMENTS

| | | | | |
|---|---|---|---|---|
| 12,150,273 | B2 * | 11/2024 | Lee | H05K 7/20927 |
| 2013/0062750 | A1 * | 3/2013 | Lenniger | H01L 25/072<br>257/691 |
| 2016/0290728 | A1 | 10/2016 | Coteus et al. | |
| 2019/0335608 | A1 * | 10/2019 | Song | H05K 7/20854 |
| 2019/0341327 | A1 * | 11/2019 | Teysseyre | H01L 23/4006 |
| 2021/0043376 | A1 * | 2/2021 | Kienle | H01G 2/08 |
| 2021/0243923 | A1 * | 8/2021 | Hwang | H05K 7/2029 |
| 2021/0313862 | A1 * | 10/2021 | Franck | H02K 5/203 |
| 2022/0369496 | A1 * | 11/2022 | Siewert | H05K 7/20927 |
| 2023/0380103 | A1 * | 11/2023 | Catuneanu | H05K 7/20927 |
| 2023/0413486 | A1 * | 12/2023 | Reinhold | H05K 7/20854 |
| 2024/0114646 | A1 * | 4/2024 | Jaggers | H05K 7/2029 |

FOREIGN PATENT DOCUMENTS

| | | | | |
|---|---|---|---|---|
| EP | 1672692 | A1 * | 6/2006 | H01L 25/072 |
| EP | 2437293 | A | 4/2012 | |
| EP | 3905318 | A | 10/2020 | |

* cited by examiner

COOLING DEVICE

The present invention relates to a (high-performance) cooling device for dissipating heat from objects to be cooled, such as, for example, from power electronics components. The invention relates further to a power electronics unit, in particular for an electric vehicle, having a plurality of power electronics components having such a cooling device.

Cooling devices for power electronics components, such as power electronics semiconductor modules, must be particularly efficient or powerful. In the case of such cooling devices having a heat sink of metal or of a metal alloy having a flat or planar heat absorption face which, when the cooling device is being used, in order to optimize the transfer of heat, is to be arranged as close as possible—optionally in direct contact or with the interposition of an intermediate layer of thermally conductive material, in particular thermally conductive paste—to a heat emission face (which, for example, is likewise planar) of the object to be cooled, the situation frequently arises that either the heat sink, or the planar heat absorption face thereof, must simultaneously be arranged on a plurality of objects to be cooled, the heat emission faces of which run in different planes owing to different height dimensions of the objects and/or different deformation of the components involved as a result of different materials, or the heat sink, or the heat absorption face thereof, must be arranged on a heat emission face of an individual object to be cooled that does not run in a planar manner throughout.

In both cases, this can result in relatively large gaps, which are disadvantageous for efficient heat transfer, in some regions between the heat emission face(s) of the object(s) to be cooled on the one hand and the planar heat absorption face of the heat sink on the other hand, which has a detrimental effect on the cooling capacity of the cooling device.

For this reason, thermally conductive pastes in comparatively large layer thicknesses are in some cases used in order to bridge the corresponding gaps, which are otherwise filled only with air, which has poor thermal conductivity. However, this solution is not optimal, inter alia because the thermally conductive pastes which can be used generally have a lower thermal conductivity than the metal/metal alloy of the heat sink.

Proceeding therefrom, the object of the present invention is to further develop a cooling device or a power electronics unit of the type mentioned at the beginning.

A cooling device according to the invention has a first (in particular elongate) hybrid cooling component through which cooling fluid can be guided and which has a heat sink, in particular a plate-like heat sink, of metal or of a metal alloy which in particular is rigid and is connected in a fluid-tight manner to a base body of plastics material of the first cooling component, and which is to be arranged on objects to be cooled. It further has a second (in particular elongate) hybrid cooling component which is connected in particular releasably to the first cooling component and through which cooling fluid can be guided, and which has a plurality of cooling component portions, preferably at least three cooling component portions, which are connected together (in pairs) in an articulated manner in particular by way of connecting joints. The cooling component portions each have a heat sink, preferably a plate-like heat sink, of metal or of a metal alloy which is to be arranged on objects to be cooled and which is connected in a fluid-tight manner to a base body of plastics material of the second cooling component, wherein the two hybrid cooling components are positioned at a distance from one another and are connected together in particular releasably with the formation of a holding space arranged between them for objects to be cooled.

By using two such different hybrid cooling components which have, inter alia, a holding space for objects to be cooled, such as, for example, for power electronics semiconductor modules, the objects to be cooled can on the one hand effectively be cooled from two sides. On the other hand, inter alia for the case where a plurality of objects to be cooled, the heat emission faces of which do not run exactly in the same plane, are to be cooled simultaneously by the hybrid cooling components, it is possible to compensate for the resulting height offset by means of the cooling component portions of the second hybrid cooling component that are connected together in an articulated manner. This is because this articulated connection correspondingly allows the individual cooling component portions likewise to be moved into different planes and individually adjusted or applied to the heat emission faces of different heights.

According to the invention, it is consequently advantageously at least not (no longer) necessary to use thermally conductive paste with a large layer thickness to bridge in particular such large gaps, which ultimately results in a higher cooling capacity of the cooling device according to the invention compared to the solutions of the prior art. It will be appreciated, however, that, even in the case of the solution according to the invention, thermally conductive paste can continue to be used between the above-mentioned faces, in particular in order to compensate for relatively small tolerances which can result, for example, from the structure of the otherwise planar heat emission faces.

In a further concretization of this concept, the heat absorption face of each heat sink of each cooling component portion of the second hybrid cooling component, which when the cooling device is being used is to be arranged on the object to be cooled, can have a heat absorption surface which is formed in particular by the underside of the heat sink, wherein the heat absorption surfaces of the individual heat sinks can then be moved relative to one another into different planes if required. Based on adjacent cooling component portions of the second hybrid cooling component, the heat absorption surface of the heat sink of one cooling component portion can then of course correspondingly be moved relative to the heat absorption surface of the other cooling component portion.

It will be appreciated that the cooling device can have (but does not have to have) a plurality of pairs of cooling component portions which are each connected together in an articulated manner in that way.

For example, there could be provided at least three cooling component portions, or two pairs of cooling component portions, having a middle cooling component portion, which is connected in an articulated manner to a first outer cooling component portion to form a first pair on a first side (of the middle cooling component portion) and which is connected in an articulated manner to a second outer cooling component portion to form a second pair on a second side (of the middle cooling component portion).

As regards the or each connecting joint with which adjacent cooling component portions are connected in an articulated manner, said connecting joint can have two, in particular parallel axes of rotation which are spaced apart from one another, about which the two cooling component portions are movable, namely pivotable, relative to one another into the different planes.

Preferably, the heat sinks of the cooling component portions of the second hybrid cooling component can each be connected to a common (elongate) base body of plastics material which has flexible, in particular pliable, connecting portions configured as in particular flat hollow bodies which form the connecting joints between adjacent cooling component portions of the second hybrid cooling component and at the same time connect them together in a fluid-conducting manner, so that cooling medium is able to flow through them between the adjacent cooling component portions.

The common base body can have in the region of each cooling component portion a depression into which the heat sink of the corresponding cooling component portion is inserted at least partially, preferably completely apart from a lateral connecting edge of the heat sink which protrudes in particular perpendicularly from a main part of the heat sink which is of substantially quadrangular form and with which the common base body is connected in a fluid-tight manner, in particular by substance-to-substance bonding and/or by interlocking engagement.

As regards the holding space of the cooling device, it can be divided into a plurality of separate partial holding spaces for objects to be cooled by means of a frame part of the cooling device that is arranged between the two hybrid cooling components, consists in particular of plastics material and is preferably configured as an injection-molded part.

Each partial holding space can be delimited by lateral delimiting members of the frame part, in particular by a pair of transverse members situated opposite and at a distance from one another and by a pair of longitudinal members situated opposite and at a distance from one another.

Preferably, adjacent partial holding spaces can share the same transverse member or can be delimited on one side by the same transverse member arranged between the adjacent partial holding spaces, wherein each connecting joint of the second hybrid cooling component is arranged next to and at a (small) distance from such a transverse member without any lateral offset, in particular above said member.

In a further embodiment of the invention, it can be provided that each cooling component portion of the second hybrid cooling component has an associated partial holding space into which the cooling component portion, in particular the heat sink thereof, has been inserted at least partially and also fitted. This is effected in particular in such a manner that longitudinal members of the frame part that are situated opposite and at a distance from one another and that laterally delimit the partial holding space each run adjacent, in particular parallel, to associated longitudinal sides of the cooling component portion and limit or prevent any movements of the cooling component portion that run transverse thereto.

In addition or alternatively, transverse members of the frame part that are situated opposite and at a distance from one another and that laterally delimit the partial holding space can each run adjacent, in particular parallel, to associated transverse sides of the cooling component portion and limit or prevent any movements of the heat sink that run transverse thereto.

As regards the frame part configured in particular as an injection-molded part, it can be fastened preferably releasably to the first hybrid component, preferably to the heat sink of the first hybrid component, in particular by means of a screw connection.

Furthermore, it can have electrical contacting elements (of electrically conductive material (metal or metal alloy, optionally also coated)) connected thereto for contacting corresponding electrical contacting elements of (electronic) objects to be cooled and/or of other/further electronic components, such as, for example, PCB components.

The connection of the electrical contacting element can in particular be configured in such a manner that the contacting element is integrated non-releasably and fixedly into the frame part.

The contacting element can have one or more connecting portions which is/are (optionally each) preferably arranged at an end of the contacting element and which can be connected to an electrical contacting element of the object to be cooled or of the other/further electronic component.

As regards the integration of the contacting element into the frame part, it can preferably take place while leaving one or more such connecting portions of the contacting element free.

The contacting element can have in particular a first connecting portion, which in particular is arranged at one end thereof and has preferably been left free during integration into the injection-molded part, with which it can be connected to an electrical contacting element of an object to be cooled, and a second connecting portion, which in particular is arranged at another end of the contacting element and has preferably been left free during integration or embedding into the injection-molded part, with which the electrical contacting element can be electrically conductively connected to an electrical contacting element of another/further electronic component, preferably to a PCB component.

Moreover, the contacting element is preferably integrated non-releasably into the frame part in that it is overmolded at least in some regions by the injection-molded plastics material of the frame part, preferably while leaving the connecting portion(s) free.

Furthermore, the or each connecting portion of the contacting element can have a press-fit geometry. Alternatively, it could also be configured, for example, as a solder contact. For example, in such a manner that the connecting portion can be electrically connected by interlocking and/or frictional engagement and/or by substance-to-substance bonding to a matching electrical contacting element of an electronic component.

If it has, for example, a press-fit geometry, in that the connecting portion is inserted into a corresponding contacting hole of a PCB component. If it is configured as a solder contact, in that it is correspondingly soldered with the connecting portion of the matching electrical contacting element of the other electronic component.

As regards the frame part, it can moreover have at least one, preferably at least two, positioning aids, which in particular are integrally connected thereto or are formed from a single material with the frame part, for positioning an electronic component, in particular a PCB component.

Moreover, the cooling device according to the invention can further have a clamping device for clamping the first hybrid cooling component to the second hybrid cooling component, so that the heat sinks of the hybrid cooling components are each able to apply pressure forces, effected by the clamping device, to objects to be cooled which can be or are arranged between them.

The clamping device can comprise a spring component which is arranged on, and applies pressure forces in the direction of the first hybrid cooling component to, the face of each cooling component portion of the second hybrid cooling component that is situated opposite the face on which the heat sink of the cooling component portion is arranged. This spring component can be clamped to the first hybrid cooling component. In particular in that it is fastened, preferably releasably, to the frame part fastened to the first hybrid cooling component, preferably is screwed thereto.

The spring component can in turn have a plurality of spring elements (in particular spring arms). In particular at least two spring elements per cooling component portion, which are pressed or can be pressed in a resilient manner against the above-mentioned face of the cooling component portion of the second hybrid cooling component. This is preferably effected in such a manner that each spring element, in particular in each case a free end thereof, is pressed or can be pressed against a projection arranged on that face or against a protuberance arranged there.

Moreover, each heat sink of each hybrid cooling component, with the base body of the hybrid cooling component connected thereto fixedly and in a fluid-tight manner, in particular in a liquid-tight manner, can wholly or partially enclose or outwardly delimit a cooling fluid space or cooling fluid lines.

The or each heat sink of the first hybrid cooling component and/or the heat sinks of the second hybrid cooling component can further have cooling fluid line portions which are delimited by (in particular parallel) cooling fins and have been introduced (for example milled) into the heat sink.

The first hybrid cooling component can further have a plurality of cooling zones which are spatially separate from one another and are connected in a fluid-conducting manner to a feed of the cooling device, in particular a feed that is common to both the hybrid cooling components, in such a manner that cooling medium flows through the cooling zones of the first hybrid cooling component in parallel in a parallel flow when cooling medium is supplied to the cooling device by way of the feed of the cooling device.

Alternatively or in addition, it can be provided that the second hybrid cooling component has a plurality of cooling zones which are spatially separate from one another and are connected in a fluid-conducting manner to a or the feed of the cooling device, which feed is in particular common to both the hybrid cooling components, in such a manner that cooling medium flows through these cooling zones of the second hybrid cooling component in succession in a serial flow when cooling medium is supplied to the cooling device by way of the feed of the cooling device.

The cooling zones of the first and of the second hybrid cooling component can preferably be configured and connected in a fluid-conducting manner to the feed, in particular the common feed, of the cooling device in such a manner that the cooling medium volume flow through the cooling zones of the first hybrid cooling component, through which cooling medium can flow in parallel, becomes greater from cooling zone to cooling zone as the distance of the cooling zone from the feed of the cooling device increases. This is in particular in order to compensate for a decreasing cooling capacity of the second hybrid cooling component from cooling zone to cooling zone—as the distance of the cooling zone of the second hybrid cooling component from the feed increases—due to the cooling medium serial flow in the second hybrid cooling component.

Moreover, each cooling component portion of the second hybrid cooling component can preferably have its own associated cooling zone, which is formed in particular by a region of the heat sink of the cooling component portion in which the heat sink has cooling fluid line portions introduced into the heat sink and delimited by (in particular parallel) cooling fins.

Each of the spatially separate cooling zones of the first hybrid cooling component can in turn be formed by a region of the heat sink thereof in which the heat sink has cooling fluid line portions introduced into the heat sink and delimited by (in particular parallel) cooling fins.

As regards the base body of the second hybrid cooling component, it can have fluid line portions of the second hybrid cooling component which are each closed in a fluid-tight manner on a side facing the holding space by the heat sink of the second hybrid cooling component.

The base body of the first hybrid cooling component can in turn have cooling fluid line portions of the first hybrid cooling component which are closed in a fluid-tight manner on a side facing the holding space by the heat sink of the first hybrid cooling component.

The base body of the first hybrid cooling component can additionally have fluid line portions of the first hybrid cooling component which are closed on the side remote from the holding space by a further, in particular plate-like, preferably rigid heat sink of metal or of a metal alloy which is connected in a fluid-tight manner to the base body. Preferably by such a further heat sink on which further objects to be cooled can be arranged or are arranged for cooling.

The feed of the cooling device and/or a drain of the cooling device, through which cooling medium is able to flow away after it has flowed through the cooling device, in particular through the cooling zones of the two hybrid cooling components, can further comprise a portion which is formed by the base body of the first hybrid cooling component (or is integrally connected to this base body).

The feed and/or the drain can be arranged on the side of the base body that is remote from the holding space.

As regards the or each base body of the first hybrid cooling component and/or the or each base body of the second hybrid cooling component, it is an injected-molded part of plastics material.

Further features of the present invention will become apparent from the accompanying patent claims, the following description of preferred exemplary embodiments, and from the accompanying drawings.

Figure 2:
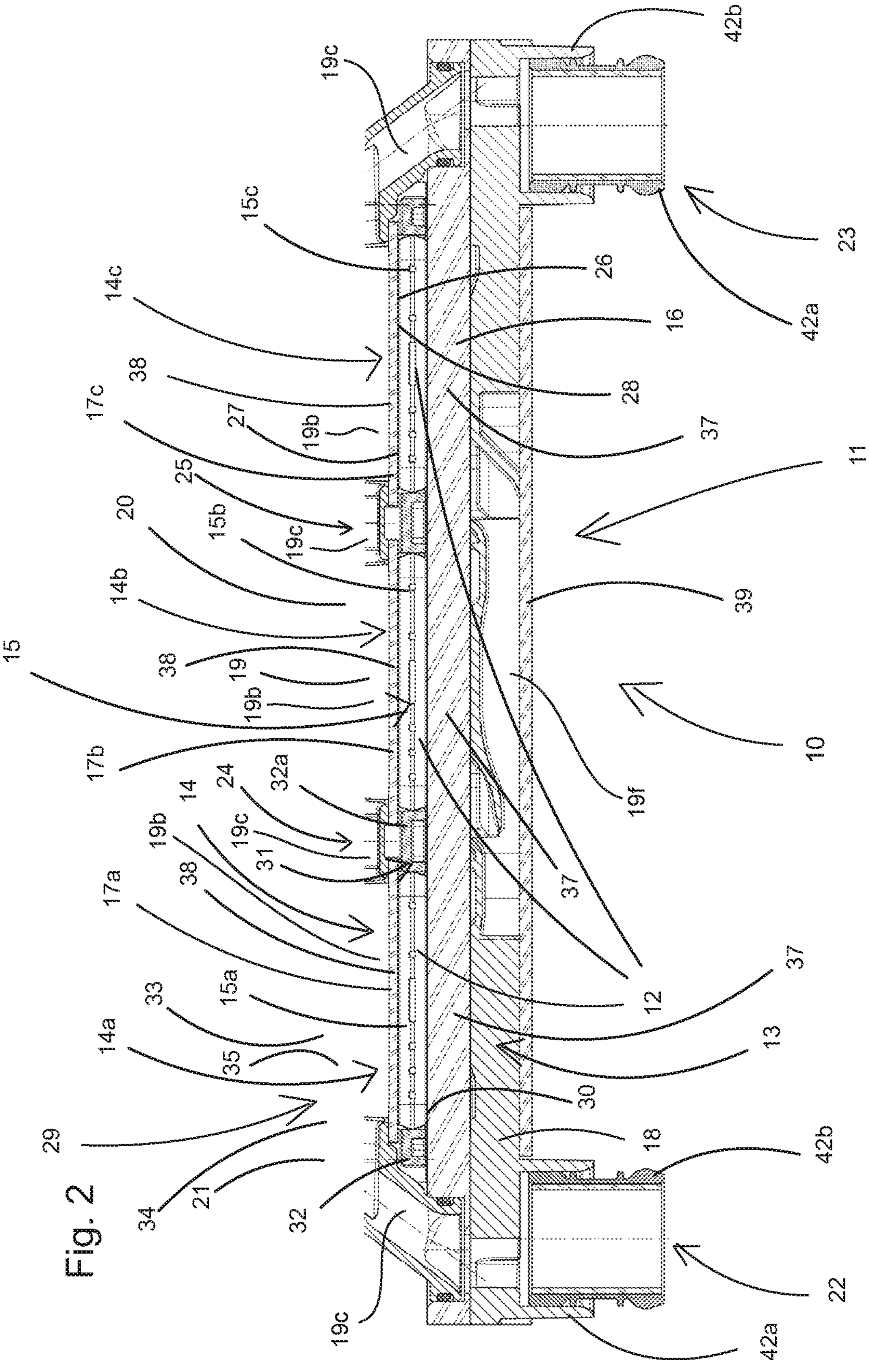
Figure 3:
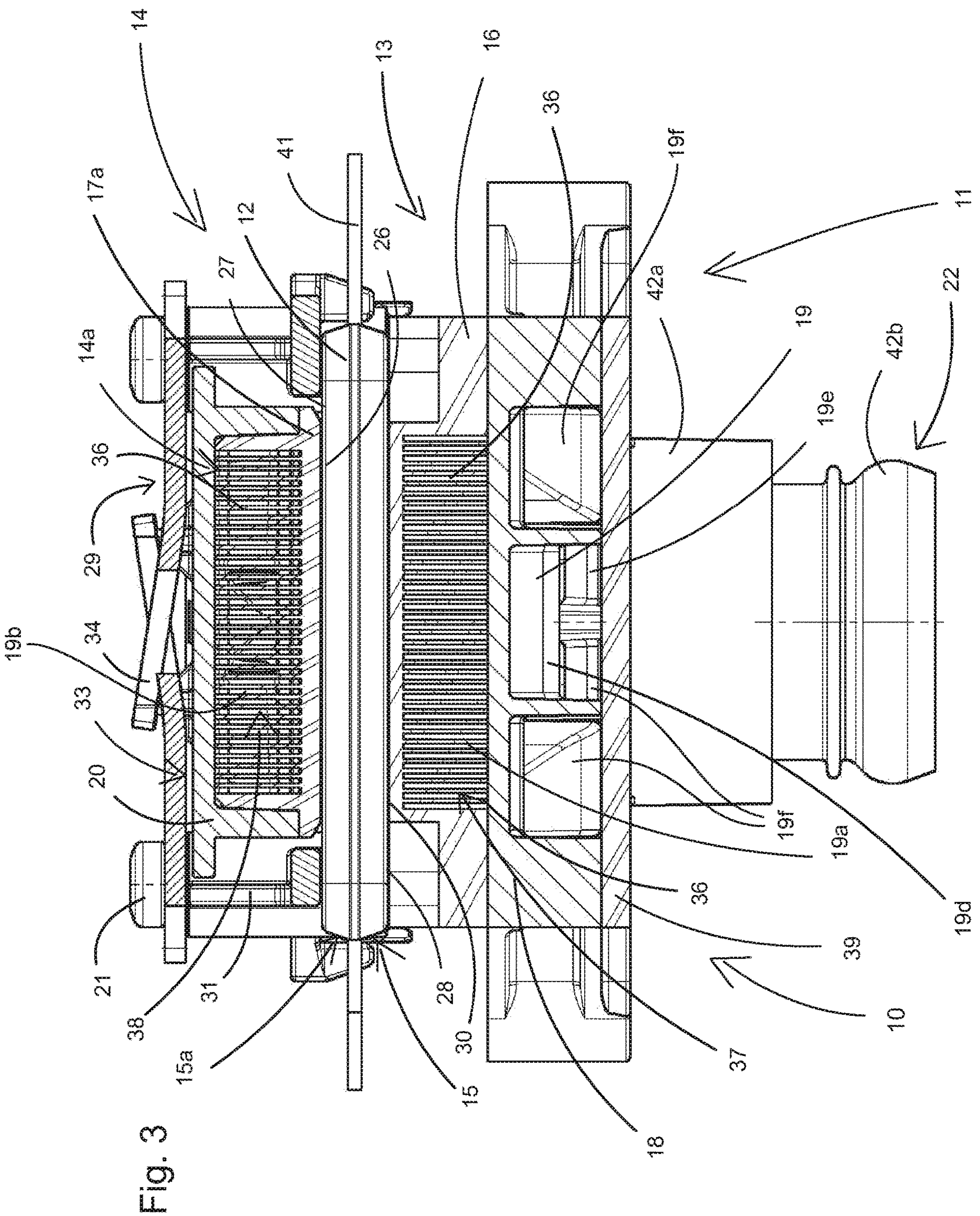
Figure 4:
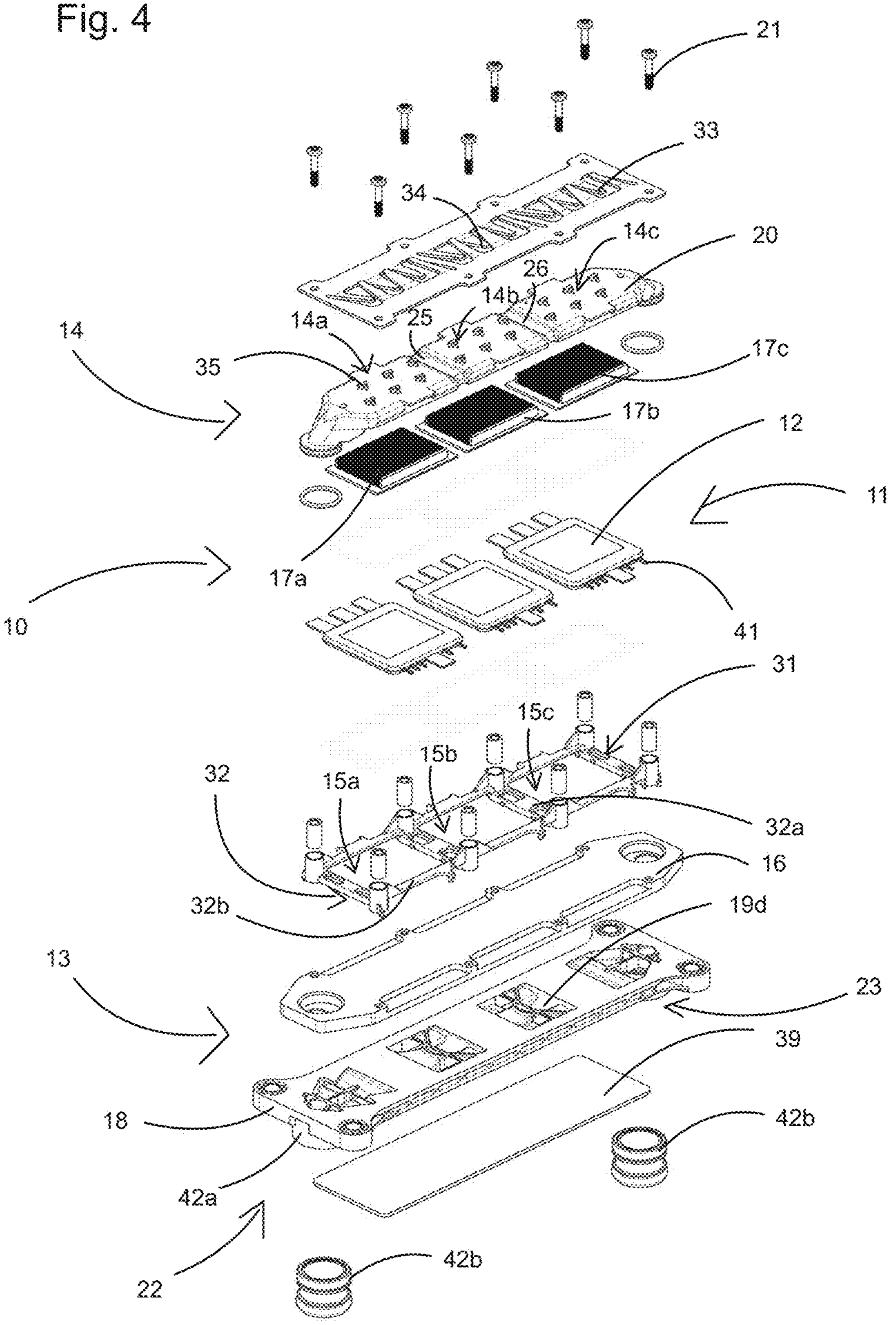
Figure 5:
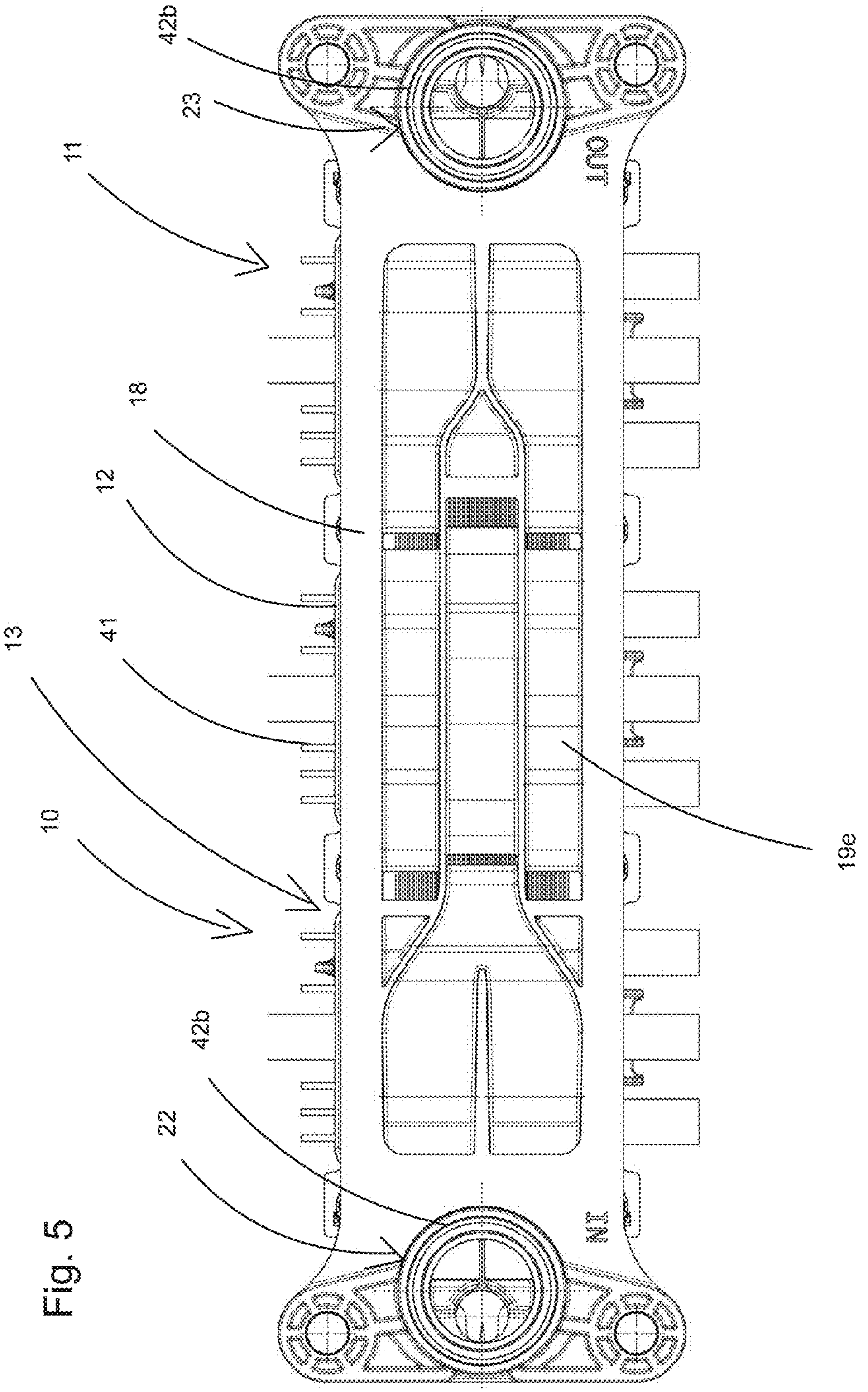
Figure 6:
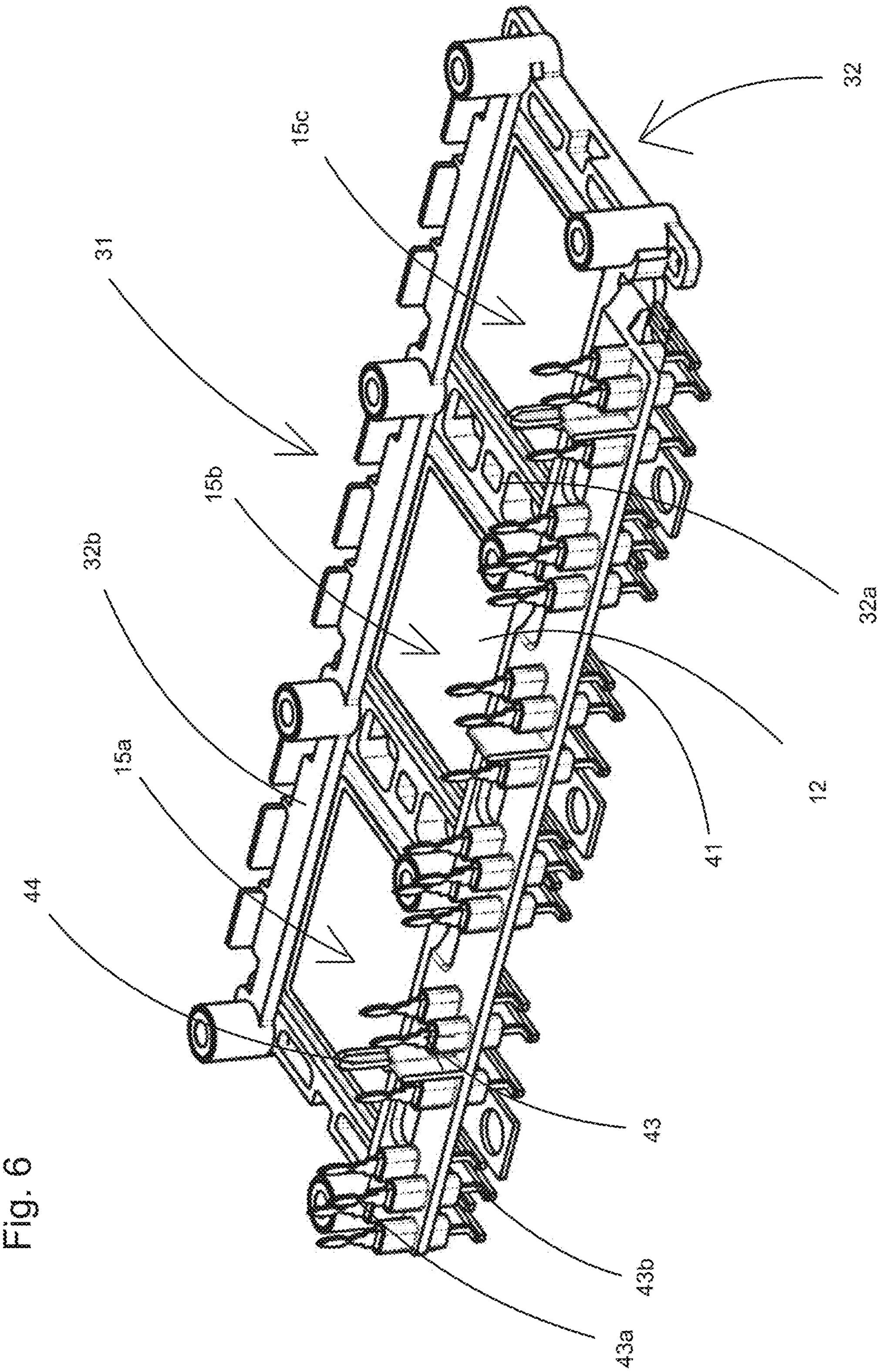

In the figures:

FIG. 1: shows a power electronics unit in an oblique view, which comprises a cooling device according to the invention having two hybrid cooling components connected together, FIG. 2: shows the power electronics unit of FIG. 1 in a longitudinal section, FIG. 3: shows the power electronics unit of FIG. 1 in a transverse section, FIG. 4: shows an exploded view of the power electronics unit of FIG. 1, FIG. 5: shows the power electronics unit of FIG. 1 in a view from beneath, but without the lower, further heat sink of the lower hybrid cooling component, FIG. 6: shows a frame part of the cooling device according to the invention in a more detailed representation.

The cooling device 11 shown in the figures serves to dissipate heat from objects to be cooled 12. The cooling device 11 is here part of a power electronics unit 10, which has power electronics components, for example power electronics semiconductor modules, as objects to be cooled 12. Such power electronics components are used inter alia in connection with batteries or rechargeable batteries of electric vehicles.

The cooling device 11 has a first, here lower, elongate hybrid cooling component 13 having an elongate, rigid heat sink 16 of metal (for example aluminum) or of a metal alloy, on which the objects to be cooled 12 are arranged or are seated and which cools, or absorbs heat from, the lower sides of the objects to be cooled 12.

The rigid heat sink 16 is connected in a fluid-tight manner to a base body 18, here an injection-molded base body, of plastics material and jointly delimits a plurality of cooling fluid lines 19 to the outside, or encloses them, so that fluid or a cooling medium, such as, for example, water, can be guided through the first hybrid cooling component 13.

The cooling device 11 further has a second, here upper, elongate hybrid cooling component 14, which has individual cooling component portions 14*a*, 14*b*, 14*c* which are connected together in an articulated manner and each have rigid heat sinks 17*a*, 17*b*, 17*c*, likewise of metal (optionally also aluminum) or of a metal alloy, which in turn cool the upper sides of the objects to be cooled 12.

In a similar manner as in the case of the first hybrid cooling component 13, each heat sink 17*a*, 17*b*, 17*c* is connected in a fluid-tight manner to here a common (elongate), injection-molded base body 20 of plastics material. They correspondingly enclose one or more fluid lines 19 or jointly delimit them to the outside, so that fluid or cooling medium can also be guided through the upper hybrid cooling component 14.

Both the heat sink 16 of the lower hybrid cooling component 13 and the heat sinks 17*a*, 17*b*, 17*c* of the upper hybrid cooling component 14 are here configured as solid bodies.

The two hybrid cooling components 13, 14 are additionally arranged at a distance from one another and releasably connected to one another, here fastened to one another by means of screws 21.

This with the formation of a holding space 15 between the two hybrid cooling components 13, 14, or between the heat sink 16 of the lower hybrid cooling component 13, in particular the (here planar) upper side thereof, and the heat sinks 17*a*, 17*b*, 17*c* of the upper hybrid cooling component 14, in particular the (here planar) lower sides thereof. The objects to be cooled 12 of the power electronics unit 10 are arranged in the holding space 15 in contact with these lower or upper sides.

The two hybrid cooling components 13, 14 are referred to as "hybrid" in view of the materials used because they consist substantially of the very different materials metal/metal alloy on the one hand and plastics material on the other hand. The fluid-tight connection of these materials which is necessary according to the invention can be effected in a wide variety of ways, for example by substance-to-substance bonding after previous structuring of the connecting surface of the metal.

The cooling device 11 further has a medium inlet or feed 22 and a medium outlet or drain 23.

The feed 22 serves as a common feed for both hybrid cooling components 13, 14, by way of which cooling medium or cooling fluid is accordingly supplied both to the lower hybrid cooling component 13 and to the upper hybrid cooling component 14, which cooling fluid then flows through the two hybrid cooling components 13 and 14 when the cooling device 11 is in operation and in so doing dissipates (waste) heat, which the heat sinks 16 and 17*a*, 17*b*, 17*c* absorb from the objects to be cooled 12.

Generally, the cooling fluid will be a cooling liquid. However, it will be appreciated that it is also within the scope of the invention to use a gaseous medium as the cooling fluid. The corresponding fluid-tight connections between the base body 18 or 20 and the heat sinks 16 and 17*a*, 17*b*, 17*c* would then have to be configured to be correspondingly gas-tight.

The articulated connection of the cooling component portions 14*a*, 14*b*, 14*c* and indirectly of the heat sinks 17*a*, 17*b*, 17*c* of the upper hybrid cooling component 14 takes place in a particular way. The cooling component portions 14*a*, 14*b*, 14*c* are connected together in an articulated manner in pairs, so that they are movable relative to one another. A first pair of cooling component portions 14*a*, 14*b* is connected together in an articulated manner by way of a first connecting joint 24 and a second pair of cooling component portions 14*b*, 14*c* by a second connecting joint 25.

Each heat sink 17*a*, 17*b*, 17*c* of the cooling component portions 14*a*, 14*b*, 14*c* has a (here planar) lower side, which forms a (outer) flat or planar heat absorption surface 26 which, when the cooling device 11 is in operation, contacts, or is situated opposite and parallel to, an opposite, here likewise planar heat emission surface 27, formed by the upper side thereof, of the object to be cooled 12, wherein thermally conductive paste can optionally also be arranged between the heat absorption surface 26 and the heat emission surface 27, the thermally conductive paste inter alia compensating for (remaining) slight unevenness of the surfaces 26 and/or 27 and thus establishing optimal thermal conduction between these surfaces.

The articulated connections of the cooling component portions 14*a*, 14*b*, 14*c* allow tolerances to be compensated for in a particular way when the cooling component portions 14*a*, 14*b*, 14*c* are in contact with or arranged on the objects to be cooled 12, as will be explained in greater detail hereinbelow.

Specifically, it is thus possible, for example, to compensate for even relatively large differences in the height dimensions of the individual objects to be cooled 12, compensation for which by means of thermally conductive paste, for example, would be (too) disadvantageous in view of optimized thermal conduction due to the necessary layer thicknesses.

In such a case of relatively large height differences (but also in other expedient cases), the individual planar heat absorption surfaces 26 of the cooling component portions 14*a*, 14*b*, 14*c* or of the upper heat sinks 17*a*, 17*b*, 17*c* can be moved into different planes, so that, despite the fact that the heat emission surfaces 27 of the objects to be cooled 12 do not run in a common plane, the heat absorption surfaces are nevertheless situated directly opposite the associated (planar) heat emission surface 27 of the object to be cooled 12, in each case at no distance or at the smallest possible distance therefrom.

The movability between the individual cooling component portions 14*a*, 14*b*, 14*c*, or the individual heat sinks 17*a*, 17*b*, 17*c*, which is necessary for this purpose is made possible, as has already been indicated above, by the connecting joints 24 and 25.

If, for example, one of the objects to be cooled 12 has a greater height than the other two objects to be cooled 12, its heat emission surface 27 runs in a different (higher) plane than the heat emission surfaces 27 of the other two objects to be cooled 12.

In order to compensate for this, the second hybrid cooling component 14 is then deformed compared to a situation in which all the heat absorption surfaces 26 of the second hybrid cooling component 14, or of the heat sinks 17*a*, 17*b*, 17*c*, lie in a common plane, by application of pressure to the cooling component portion 14*a*, 14*b*, 14*c* or indirectly to the heat sinks 17*a*, 17*b*, 17*c*.

Specifically, these forces act on the individual heat sinks 17*a*, 17*b*, 17*c* and in particular ensure a suitable relative movement between the heat sinks 17*a*, 17*b*, 17*c* which compensates for the above-mentioned height difference.

Thus, a corresponding orientation or movement of the individual heat sinks 17*a*, 17*b*, 17*c* is made possible in such a manner that all the heat absorption surfaces 26 of the heat sinks 17*a*, 17*b*, 17*c* are then in contact with their associated or opposite upper heat emission surface 27 of their associated object to be cooled 12.

Moreover, by connecting the lower and upper hybrid cooling components 13, 14 together, (counter) pressure forces of the heat sink 16 of the lower hybrid cooling component 14 at the same time act on lower heat emission surfaces 28 of the objects to be cooled 12, which are situated opposite the upper heat emission surfaces 27, so that a or the (upper) heat absorption surface 30 of the lower hybrid cooling component 13 and the opposite lower heat emission surface 28 of the object to be cooled 12 are optimally in tight/close contact with one another for heat transfer.

The connecting joints 24, 25 are here formed by intermediate portions of the plastics base body 20 which are arranged between adjacent cooling component portions 14*a*, 14*b*, 14*c* and with which each heat sink 17*a*, 17*b*, 17*c* is connected in a fluid-tight manner. The connecting joints 24, 25 are here connecting or intermediate portions configured as flexible, in particular pliable, and flat hollow bodies surrounding a cooling fluid line portion, which here are part of the base body 20 (in each case formed of one material therewith or integrally connected thereto), which connect the adjacent cooling component portions 14*a*, 14*b*, 14*c* of the second hybrid cooling component 14 together in a correspondingly fluid-conducting manner, so that cooling medium is able to flow through them between the adjacent cooling component portions 14*a*, 14*b*, 14*c*.

The connecting joints 24, 25 or intermediate portions have a smaller height or thickness than the regions of the base body 20 that together with the respective heat sink 17*a*, 17*b*, 17*c* form the cooling component portions 14*a*, 14*b*, 14*c*.

The forces with which the cooling component portions 14*a*, 14*b*, 14*c*, or the heat sinks 17*a*, 17*b*, 17*c* thereof, are each pressed in the direction of the upper heat emission surfaces 27 of the objects to be cooled 12, or the heat sink 16 presses the heat absorption surface 30 of the lower hybrid cooling component 13 in the direction of the lower heat emission surfaces 28 of the objects to be cooled 12, are applied by a clamping device 29, as will be explained in greater detail hereinbelow.

Firstly, as regards the above-mentioned holding space 15 of the cooling device 11 in which the objects to be cooled 12 are seated, it is divided in the longitudinal direction, here by a frame part 31 which is arranged between the two hybrid cooling components 13, 14 and is here configured as an injection-molded plastics component, into a plurality of separate partial holding spaces 15*a*, 15*b*, 15*c* for the objects to be cooled 12. An object to be cooled 12 is seated in an associated partial holding space 15*a*, 15*b* or 15*c*. Each cooling component portion 14*a*, 14*b*, 14*c* of the upper hybrid cooling component 14, in particular the respective heat sink 17*a*, 17*b*, 17*c* thereof, is inserted at least partially into the associated partial holding space 15*a*, 15*b*, 15*c* and is fitted therein in an accurately fitting manner.

Each partial holding space 15*a*, 15*b*, 15*c* is delimited by lateral delimiting members 32 of the frame part 31, each of which is arranged, at only a small distance, laterally (outside) and next to the corresponding longitudinal side or transverse side of the associated cooling component portion 14*a*, 14*b*, 14*c*.

The delimiting members 32 of each partial holding space 15*a*, 15*b*, 15*c* are a pair of transverse members 32*a* situated opposite and at a distance from one another and a pair of longitudinal members 32*b* situated opposite and at a distance from one another.

Adjacent partial holding spaces 15*a*, 15*b*, 15*c* share the same transverse member 32*a* or are delimited on one side by the same transverse member 32*a* arranged between the adjacent partial holding spaces 15*a*, 15*b*, 15*c*, wherein each connecting joint of the upper hybrid cooling component 14 is here arranged directly above the respective transverse member 32*a* at a slight distance therefrom and without any lateral offset relative thereto.

The longitudinal members 32*b* of the frame part 31, which are situated opposite and at a distance from one another and laterally delimit the respective partial holding space 15*a*, 15*b*, 15*c*, each run adjacent and parallel to associated longitudinal sides of the respective associated cooling component portion 14*a*, 14*b*, 14*c* and limit or prevent any movements of the respective cooling component portion 14*a*, 14*b*, 14*c* that run transverse thereto.

The transverse members 32*a* of the frame part 31, which are situated opposite and at a distance from one another and laterally delimit the respective partial holding space 15*a*, 15*b*, 15*c*, in turn each run adjacent and parallel to associated transverse sides of the respective cooling component portion 14*a*, 14*b*, 14*c* and limit or prevent any movements of the cooling component portion 14*a*, 14*b*, 14*c* that run transverse thereto.

The frame part 31 is, moreover, releasably fastened to the lower hybrid cooling component 13 by means of screws 21, which are screwed into the heat sink 16 thereof.

The frame part 31 further has (shown only in FIG. 6) electrical contacting elements 43 of metal which are connected thereto or fastened thereto.

The contacting elements 43 are here fixedly integrated into the frame part 31 configured as an injection-molded part in that they are overmolded in some regions by the injection-molded plastics material thereof with the formation of a connection, in particular a substance-to-substance connection, thereof (they form insert parts in the injection molding process of the frame part).

Connecting portions 43*a* and 43*b* arranged at opposite (free) ends are not overmolded, or are left free.

The (upper) connecting portions 43*a* can, for example as shown, be configured as press-fit portions or can have a press-fit geometry, so that they can each be electrically conductively connected in a simple manner to a contacting element (not shown) of a further electronic component.

For example, the power electronics unit 10 can have a circuit board or PCB (not shown), with which the objects to be cooled 12 (power electronics semiconductor modules) are each electrically connected (both for control functions and for the power supply).

For this purpose, each connecting portion 43*a* can then be inserted or pressed into a corresponding contacting hole (with a corresponding metallic contact) of the circuit board or PCB.

Alternatively, the (upper) connecting portions 43*a* could, however, also be configured as solder contacts, so that they would correspondingly be soldered to the circuit board.

Each of the lower connecting portions 43*b* can then be electrically conductively connected to one of the contacting elements 41 of the corresponding object to be cooled 12, for example can be welded thereto.

As soon as/because the frame part 31 has been fixed to the cooling device 11, or here to the upper heat sink 16 of the lower hybrid cooling component 13, the contacting elements 43 are accordingly fixedly fixed in position in all directions.

According to the invention, therefore, during mounting of the power electronics unit 10, the objects to be cooled 12 can already be positioned during the above-described welding process inside the partial holding spaces 15*a-c* of the frame part 31, which has already been fixed to the lower hybrid cooling component 13, and there can largely be fixed, or at least limited in terms of any movements, in two movement directions by the delimiting members 32, so that welding can be carried out accurately in terms of position.

Moreover, the frame part 31 further has two positioning aids 44, formed from one material therewith or integrally connected thereto and here extending upward, which can engage into matching guide holes of the PCB, for example, during mounting of the power electronics unit 10 in order thus also to ensure exact positioning of the PCB relative to the other components.

The positioning aids 44 are here each configured as an (upwardly extending) elongate positioning element or positioning pin.

As has already been mentioned above, the lower hybrid cooling component 13 is clamped to the upper hybrid cooling component 14 by the clamping device 29, so that the heat sinks 16, 17*a*, 17*b*, 17*c* of the hybrid cooling components 13, 14 each apply pressure forces effected by the clamping device 29 to the objects to be cooled 12 which are arranged between them, namely in the holding space 15.

The clamping device 29 comprises a flat spring component 33 having individual spring elements, or here spring arms 34, which here forms the uppermost, or an external, component of the cooling device 11 and is arranged (externally) on the (outer) face of each cooling component portion 14*a*, 14*b*, 14*c* of the upper hybrid cooling component 14 and applies pressure forces thereto in the direction of the lower hybrid cooling component 13. This spring component 33 is clamped to the lower hybrid cooling component 13, which here likewise forms part of the clamping device 29, in that it is in turn screwed to the frame part 31 screwed to the lower hybrid cooling component 13.

The spring component 33 can in turn have a plurality of spring arms 34 each having a free end. Here there are three spring arms 34 per cooling component portion 14*a*, 14*b*, 14*c*, which are pressed resiliently against the above-mentioned (outer) face of the cooling component portion 14*a*, 14*b*, 14*c* of the upper hybrid component 14. This is effected in such a manner that, inter alia, each free end of each spring arm 34 presses against a projection arranged on that side, or against a protuberance 35 arranged there.

As has already been indicated above, each heat sink 16, 17*a*, 17*b*, 17*c* of each hybrid cooling component 13, 14, together with the respective base body 18 or 20 of the respective hybrid cooling component 13 or 14 that is fixedly connected thereto in a fluid-tight manner, completely surrounds a cooling fluid chamber or delimits said chamber at least partially to the outside or forms therewith cooling fluid lines 19 of the cooling device 11.

The heat sink 16 of the lower hybrid cooling component 13 and the heat sinks 17*a*, 17*b*, 17*c* of the upper hybrid cooling component 14 each have cooling fluid line portions 19*a* or 19*b*, delimited by parallel cooling fins 36 and introduced into the heat sinks 16, 17*a*, 17*b*, 17*c*, of the cooling fluid lines 19 of the cooling device 11.

In a particular manner, during operation, starting from the common feed 22 for the two hybrid cooling components 13, 14, the flow of cooling medium takes place through the lower and the upper hybrid cooling components 13, 14, specifically through the lower hybrid cooling component 13 in a parallel flow and through the upper hybrid cooling component 14 in a serial flow.

For this purpose, the lower hybrid cooling component 13 has three cooling zones 37 which are spatially separate from one another and follow one another in the longitudinal direction and which are so configured and connected in a fluid-conducting manner to the common feed 22 that cooling medium supplied by way of the feed 22 flows through the cooling zones 37 in succession in a serial flow. Each of these three cooling zones 37 is formed by a separate region of the heat sink 16, in which the heat sink has the cooling fluid line portions 19*a* introduced into the heat sink 16 and delimited by the cooling fins 36.

The upper hybrid cooling component 14 (also) has three cooling zones 38 which are spatially separate from one another and follow one another in the longitudinal direction, but which are so configured and connected in a fluid-conducting manner to the feed 22 that the cooling medium supplied by way of the feed 22 flows through these cooling zones 38 in parallel in a parallel flow. Each of these cooling zones 38 is formed by a cooling component portion 14*a*, 14*b*, 14*c* of the upper hybrid cooling component 14. In particular in each case by a region of the heat sink 17*a*, 17*b*, 17*c* of the cooling component portion 14*a*, 14*b*, 14*c* in which the heat sink has the cooling fluid line portions 19*b* introduced into the heat sink 17*a*, 17*b*, 17*c* and delimited by the parallel cooling fins 36.

The cooling zones 37, 38 of the hybrid cooling components 13, 14 are further configured to be connected in a fluid-conducting manner to the feed 22 in such a manner that the cooling medium volume flow through the cooling zones 37 of the lower hybrid cooling component 13, through which cooling medium flows in parallel, becomes larger from cooling zone 37 to cooling zone 37 as the distance of the cooling zone 37 from the feed 22 increases.

This is primarily in order to compensate for a decreasing cooling capacity of the second hybrid cooling component 14 from cooling zone 38 to cooling zone 38—as the distance of the cooling zone 38 of the second hybrid cooling component 14 from the feed 22 increases—due to the cooling medium serial flow in the upper hybrid cooling component 14.

As regards the base body 20 of the upper hybrid cooling component 14, said base body further has cooling fluid line portions 19*c* (these are integrated into or formed by the base body 20) of the cooling fluid lines 19, which extend to a (lower) face facing the holding space 15, where they are closed in a fluid-tight manner to the bottom by the respective heat sink 17*a*, 17*b*, 17*c* while each being connected to the cooling fluid line portions 19*b*, delimited by the cooling fins 36, of the respective heat sink 17*a*, 17*b*, 17*c*.

The base body 18 of the lower hybrid cooling component 13 in turn has cooling fluid line portions 19*d* which are integrated therein or formed thereby and which extend to the (upper) face facing the holding space 15, where they are closed in a fluid-tight manner to the top by the heat sink 16 while each being connected to the cooling fluid line portions 19*a*, delimited by the cooling fins 36, of the heat sink 16.

Finally, cooling fluid line portions 19*e* end at the face of the base body 18 that is remote from the holding space 15, where they are connected to cooling fluid line portions 19*f* of a further plate-like, rigid heat sink 39 of metal or a metal alloy which is connected in a fluid-tight manner to the base body 18, and which are closed to the bottom by this further heat sink 39. Additional objects to be cooled can be arranged on this further heat sink 39 if required.

As regards the feed 22 and the drain 23 of the cooling device 11, these are arranged on the side of the base body 18 that is remote from the holding space 15. They here comprise connecting portions 42*a* formed by the base body 18 (each formed of the same material as the base body or integrally connected thereto) and separate connecting parts 42*b* inserted into the connecting portions 42*a*.

All the described features of the exemplary embodiments explained above with reference to the drawings are moreover to be understood only by way of example and do not constitute any limitation of the invention.

LIST OF REFERENCE SIGNS

10 power electronics unit
11 cooling device
12 objects to be cooled
13 lower hybrid cooling component
14 upper hybrid cooling component
14*a-c* cooling component portions
15 holding space
15*a-c* partial holding spaces
16 upper heat sink of lower hybrid cooling component
17*a-c* heat sink of upper hybrid cooling component
18 base body of lower hybrid cooling component
19 cooling fluid lines
19*a* cooling fluid line portions of heat sink of lower hybrid cooling component
19*b* cooling fluid line portions of heat sink of upper hybrid cooling component
19*c* cooling fluid line portions of base body of upper hybrid cooling component
19*d* cooling fluid line portions of base body of lower hybrid cooling component
19*e* cooling fluid line portions of base body of lower hybrid cooling component
20 base body of upper hybrid cooling component
21 screws
22 feed
23 drain
24 first connecting joint
25 second connecting joint
26 heat absorption surfaces of second hybrid cooling component
27 upper heat emission surface of the objects to be cooled
28 lower heat emission surface of the objects to be cooled
29 clamping device
30 upper heat absorption surface of first hybrid cooling component
31 frame part
32 delimiting members
32*a* transverse members
32*b* longitudinal members
33 spring component
34 spring arms
35 protuberance
36 cooling fins
37 cooling zones of lower hybrid cooling component
38 cooling zones of upper hybrid cooling component
39 lower (further) heat sink of lower hybrid cooling component
41 contacting elements of the objects to be cooled
42*a* connecting portions feed/drain
42*b* connecting parts
43 contacting elements frame part
43*a* connecting portion contacting element frame part
43*b* connecting portion contacting element frame part
44 positioning aids

The invention claimed is:

1. A cooling device for dissipating heat from objects to be cooled, such as, for example, from power electronic modules, having a first hybrid cooling component through which cooling fluid can be guided and which has a heat sink of (optionally coated) metal or of a (optionally coated) metal alloy, which is connected in a fluid-tight manner to a base body of plastics material of the first hybrid cooling component and which is to be arranged on the objects to be cooled, and having a second hybrid cooling component which is connected to the first hybrid cooling component and through which the cooling fluid can be guided, and which has a plurality of cooling component portions, which are connected together (in pairs) in an articulated manner and each have a heat sink of (optionally coated) metal or of a (optionally coated) metal alloy which is to be arranged on the objects to be cooled and which is connected in a fluid-tight manner to a base body of plastics material of the second hybrid cooling component, wherein the two hybrid cooling components are positioned at a distance from one another and are connected together with the formation of a holding space arranged between them for the objects to be cooled, wherein the cooling device has a clamping device for clamping the first hybrid cooling component to the second hybrid cooling component, so that the heat sinks of the hybrid cooling components are each able to apply pressure forces, effected by the clamping device, to objects to be cooled which can be arranged between them, and the clamping device comprises a spring component which is arranged on, and applies pressure forces in the direction of the first hybrid cooling component to, the face of each cooling component portion of the second hybrid cooling component that is situated opposite the face on which the heat sink of the cooling component portion is arranged, and wherein this spring component is clamped to the first hybrid cooling component.

2. The cooling device as claimed in claim 1, wherein the holding space is divided into a plurality of separate partial holding spaces for the objects to be cooled by means of a frame part of the cooling device that is arranged between the two hybrid cooling components.

3. The cooling device as claimed in claim 2, wherein each partial holding space is delimited by lateral delimiting members of the frame part, by a pair of transverse members situated opposite and at a distance from one another and by a pair of longitudinal members situated opposite and at a distance from one another.

4. The cooling device as claimed in claim 3, wherein adjacent partial holding spaces share the same transverse members, or are delimited on one side by the same transverse member arranged between the adjacent partial holding spaces, and/or wherein each connecting joint of the second hybrid cooling component is arranged next to and at a distance from the transverse member without any lateral offset.

5. The cooling device as claimed in claim 2, wherein each cooling component portion of the second hybrid cooling component has an associated partial holding space into which the cooling component portion, has been inserted at least partially and also fitted, in such a manner that longitudinal members of the frame part that are situated opposite and at a distance from one another and that laterally delimit the partial holding space each run adjacent, to associated longitudinal sides of the cooling component portion and limit or prevent any movements of the cooling component portion that run transverse thereto, and/or wherein transverse members of the frame part that are situated opposite and at a distance from one another and that laterally delimit the partial holding space each run adjacent, to associated transverse sides of the cooling component portion and limit or prevent any movements of the heat sink that run transverse thereto.

6. The cooling device as claimed in claim 2, wherein the frame part is fastened to the first hybrid component.

7. The cooling device as claimed in claim 2, wherein the frame part has electrical contacting elements connected thereto for contacting electrical contacting elements of the objects to be cooled.

8. The cooling device as claimed in claim 7, wherein each electrical contacting element is connected to the frame part in a non-releasable and fixed manner.

9. The cooling device as claimed in claim 8, wherein the electrical contacting element is integrated non-releasably into the frame part in that it is overmolded at least in some regions by the injection-molded plastics material of the frame part.

10. The cooling device as claimed in claim 8, wherein the or each connecting portion of the electrical contacting element has a press-fit geometry or is configured as a solder contact.

11. The cooling device as claimed in claim 7, wherein the electrical contacting element has a first connecting portion, with which it can be connected to the electrical contacting element of a respective object to be cooled.

12. The cooling device as claimed in claim 2, wherein the frame part has at least one positioning aid for positioning an electronic component.

13. The cooling device as claimed in claim 1, wherein the spring component has a plurality of spring elements, having a free end, which are pressed or can be pressed in a resilient manner against the above-mentioned face of the cooling component portion of the second hybrid cooling component.

14. The cooling device as claimed in claim 1, wherein each heat sink of each hybrid cooling component has a heat absorption surface, for contact with or arrangement on a respective object to be cooled.

15. The cooling device as claimed in claim 14, wherein the heat sinks of heat sink portions of the second hybrid cooling component are connected in an articulated manner to one another.

16. The cooling device as claimed in claim 1, wherein each heat sink of each hybrid cooling component, with the base body connected thereto in a fixed and fluid-tight manner, completely or partially encloses or delimits to the outside a cooling fluid space.

17. The cooling device as claimed in claim 1, wherein the heat sink of the first hybrid cooling component and/or the heat sinks of the second hybrid cooling component have cooling fluid line portions which are delimited by cooling fins and have been introduced into the heat sink.

18. The cooling device as claimed in claim 1, wherein the first and/or the second hybrid cooling component each has a plurality of cooling zones which are spatially separate from one another and which are connected in a fluid-conducting manner to a feed of the cooling device, which feed is common to the hybrid cooling components, in such a manner that a cooling medium supplied by way of the feed flows through the cooling zones of the first hybrid cooling component in parallel in a parallel flow and/or that a cooling medium supplied by way of the feed flows through the cooling zones of the second hybrid cooling component in succession in a serial flow.

19. The cooling device as claimed in claim 18, wherein each cooling component portion of the second hybrid cooling component has its own associated cooling zone, which is formed by a region of the heat sink of the cooling component portion in which the heat sink has cooling fluid line portions introduced into the heat sink and delimited by cooling fins.

20. The cooling device as claimed in claim 18, wherein each of spatially separate cooling zones of the first hybrid cooling component is formed by a region of the heat sink thereof in which the heat sink has cooling fluid line portions introduced into the heat sink and delimited by cooling fins.

21. The cooling device as claimed in claim 18, wherein the cooling zones of the first and of the second hybrid cooling component are configured and connected in a fluid-conducting manner to the feed, of the cooling device in such a manner that the cooling medium volume flow through the cooling zones of the first hybrid cooling component, through which the cooling medium can flow in parallel, becomes greater from between respective ones of the cooling zones of the first hybrid cooling component as the distance of the cooling zone from the feed of the cooling device increases, in order to compensate for a decreasing cooling capacity between respective ones of the cooling zones of the first hybrid cooling component, as the distance of the cooling zone of the second hybrid cooling component from the feed increases, due to the cooling medium serial flow in the second hybrid cooling component.

22. The cooling device as claimed in claim 1, wherein the heat sinks of the cooling component portions of the second hybrid cooling component are each connected to a common (elongate) base body of plastics material which has flexible, connecting portions which form connecting joints between adjacent cooling component portions of the second hybrid cooling component and connect them together in a fluid-conducting manner, so that the cooling medium is able to flow through them between the adjacent cooling component portions.

23. The cooling device as claimed in claim 22, wherein the common base body has in the region of each cooling component portion a depression into which the heat sink of the corresponding cooling component portion is inserted at least partially.

24. The cooling device as claimed in claim 1, wherein the base body of the second hybrid cooling component has fluid line portions of the second hybrid cooling component which are each closed in a fluid-tight manner on a side facing the holding space by the heat sinks of the second hybrid cooling component.

25. The cooling device as claimed in claim 1, wherein the base body of the first hybrid cooling component has fluid line portions of the first hybrid cooling component which are closed in a fluid-tight manner on a side facing the holding space by the heat sink of the first hybrid cooling component.

26. The cooling device as claimed in claim 1, wherein the base body of the first hybrid cooling component has fluid line portions of the first hybrid cooling component which are closed on the side remote from the holding space by a further heat sink of (optionally coated) metal or of a (optionally coated) metal alloy which is connected in a fluid-tight manner to the base body.

27. The cooling device as claimed in claim 1, wherein a feed of the cooling device and/or a drain of the cooling device, through which the cooling medium is able to flow away after it has flowed through the cooling device, through cooling zones of the two hybrid cooling components, comprises a portion which is formed by the base body of the first hybrid cooling component (or is integrally connected to this base body).

28. The cooling device as claimed in claim 27, wherein the feed and/or the drain is arranged on the side of the base body that is remote from the holding space.

29. The cooling device as claimed in claim 1, wherein the base body of the first hybrid cooling component and/or the base body of the second hybrid cooling component is an injection-molded part of plastics material.

30. A power electronics unit, having a cooling device as claimed in claim 1 and a plurality of power electronics components which, for the cooling thereof, are arranged in the holding space of the cooling device.

* * * * *